United States Patent
Hautala

(10) Patent No.: US 7,115,511 B2
(45) Date of Patent: Oct. 3, 2006

(54) GCIB PROCESSING OF INTEGRATED CIRCUIT INTERCONNECT STRUCTURES

(75) Inventor: John J. Hautala, Beverly, MA (US)

(73) Assignee: Epion Corporation, Billerica, MA (US)

( * ) Notice: Subject to any disclaimer, the term of this patent is extended or adjusted under 35 U.S.C. 154(b) by 208 days.

(21) Appl. No.: 10/701,573

(22) Filed: Nov. 5, 2003

(65) Prior Publication Data

US 2004/0137733 A1    Jul. 15, 2004

Related U.S. Application Data

(60) Provisional application No. 60/424,967, filed on Nov. 8, 2002.

(51) Int. Cl.
*H01L 21/302* (2006.01)
(52) U.S. Cl. ...................................... 438/689
(58) Field of Classification Search ................ 438/690, 438/706, 689
See application file for complete search history.

(56) References Cited

U.S. PATENT DOCUMENTS

| | | | | |
|---|---|---|---|---|
| 5,674,787 A * | 10/1997 | Zhao et al. | ................. | 438/627 |
| 5,683,547 A * | 11/1997 | Azuma et al. | ............... | 438/695 |
| 5,814,194 A * | 9/1998 | Deguchi et al. | ......... | 204/192.1 |
| 5,985,762 A * | 11/1999 | Geffken et al. | ............. | 438/687 |
| 6,812,147 B1 * | 11/2004 | Skinner et al. | ............. | 438/690 |
| 6,863,786 B1 * | 3/2005 | Blinn et al. | ............ | 204/192.34 |
| 2002/0017454 A1 * | 2/2002 | Kirkpatrick | ............ | 204/192.34 |
| 2002/0036261 A1 * | 3/2002 | Dykstra | ...................... | 250/287 |

OTHER PUBLICATIONS

K. Yamanishi et al. "Industrial Applications of ICB deposition for the fabrication of electronic devices." Nucl. Instr. & Meth. in Phys. Res. B 99 (1995) 233-236.
J. Baliga (Assoc. Ed.) "Depositing Diffusion Barriers." Semiconductor International (Mar. 1997) 77-81.
A. E. Braun (Assoc. Ed.) "Copper Electroplating Enters Mainstream Processing." Semiconductor International (Apr. 1999) 58-66.

* cited by examiner

*Primary Examiner*—Scott Geyer
(74) *Attorney, Agent, or Firm*—Jerry Cohen; John Hamilton

(57) ABSTRACT

Method for removing and/or redistributing material in the trenches and/or vias of integrated circuit interconnect structures by a gas cluster ion beam (GCIB) is described to improve the fabrication process and quality of metal interconnects in an integrated circuit. The process entails opening up an undesired 'necked in' region at the entrance to the structure, re-depositing the barrier metal from thicker areas such as the neck or bottom of the structure to the side walls and/or removing some of the excess and undesired material on the bottom of the structure by sputtering. The GCIB process may be applied after the barrier metal deposition and before the copper seed layer/copper electroplating or the process may be applied after the formation of the copper seed layer and before electroplating. The method may extend the usability of the known interconnect deposition technologies to next generation integrated circuits and beyond.

35 Claims, 6 Drawing Sheets

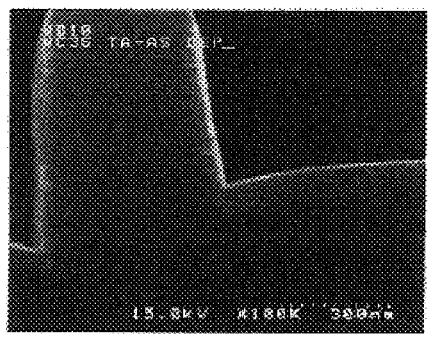 
Figure 5                    Figure 6

GCIB PROCESSING OF INTEGRATED CIRCUIT INTERCONNECT STRUCTURES

CROSS-REFERENCE TO RELATED APPLICATIONS

This application claims the benefit of priority to U.S. Provisional Application Ser. No. 60/424,967 filed Nov. 8, 2002, and entitled "GCIB Processing Of Dual Damascene Structures", the contents of which are hereby incorporated by reference.

FIELD OF THE INVENTION

This invention relates generally to applying gas cluster ion beams (GCIB) to integrated circuit interconnect structures in order to improve the fabrication process and quality of metal interconnects in an integrated circuit, and, more particularly to improve the process and quality by removing and/or redistributing material in the trenches and/or vias of integrated circuit interconnect structures, including dual damascene interconnect structures.

BACKGROUND OF THE INVENTION

In the semiconductor industry, increasing circuit density drives progress toward smaller and smaller dimensions and larger numbers of transistors placed in an individual device. The challenge to interconnect these transistors becomes increasingly difficult. Some of the problems faced with denser interconnections are increased heat dissipation, greater power consumption, and longer signal delays resulting from higher resistance in the interconnects. The need for smaller dimensions led the industry to develop the dual damascene process. The dual damascene process involves etching a pattern of trenches and holes in a dielectric layer of a semiconductor and subsequently depositing a metal to fill the pattern. A chemical mechanical polishing (CMP) step is then used to planarize the surface before the next layer of dielectric material is deposited and patterned. The filled trenches form the metal interconnect lines and the filled holes form the contact vias which connect the various metal layers to one another.

The development of the dual damascene process allowed the industry to develop devices with high aspect ratio features as well as to develop devices with copper, rather than aluminum, as the interconnect metal. One of the difficulties with fabricating such high aspect ratio interconnect structures is the barrier material, which is employed to encapsulate the metal conductor to prevent diffusion into the surrounding semiconductor materials, must be deposited in such a way as to form a continuous layer on the sidewalls of the trenches and vias. Typical barrier materials used are Ta, TiN, TaN, WN, etc. The current methods of depositing such barrier thin films are Physical Vapor Deposition (PVD), Ionized Physical Vapor Deposition (iPVD), and Chemical Vapor Deposition (CVD). The current methods of depositing the copper interconnect metal further require a copper seed layer to be deposited before the subsequent filling of the trenches and vias with electroplated copper.

Depositing these barrier materials and copper seed layers into high aspect ratio, sub-quarter micron vias and trenches often result in uneven thicknesses at the top of the structure, on the side walls and on the bottom of the structure. These effects result in at least three distinct problems that negatively influence the performance of the semiconductor device. First, an excessive overhang of material at the top of the trench or via may cause a "necking in" of the opening which may restrict or prohibit subsequent thin film depositions and/or filling of the structure with the interconnect metal. This problem may then result in voids in the interconnect metal and thus failed devices. Second, a poor sidewall coverage, especially near the bottom corners of the structure, results in too thin of a barrier material layer to prevent copper diffusion and/or too thin of a copper seed layer to allow subsequent copper electroplating and thus failed devices. Third, a build up of material at the bottom of the trenches or vias due to excessive barrier thin film deposition may cause the structures to have substantially higher intrinsic resistivities (typically 100–1000 micro-Ohm-cm) compared to the interconnect metals (1.7 to 3.5 micro-Ohm-cm). This problem results in a significantly higher contact resistance for the interconnect metal and thus negatively influences the performance/speed of the device.

The use of a GCIB for etching or cleaning planar material surfaces is known (see for example, U.S. Pat. No. 5,814,194, Deguchi et al.) in the art. For purposes of this discussion, gas clusters are nano-sized aggregates of materials that are gaseous under conditions of standard temperature and pressure. Such clusters typically consist of aggregates of from a few to several thousand molecules loosely bound to form the cluster. The clusters can be ionized by electron bombardment or other means, permitting them to be formed into directed beams of known and controllable energy. The larger sized clusters are often the most useful because of their ability to carry substantial energy per cluster ion, while yet having only modest energy per molecule. The clusters disintegrate on impact, with each individual molecule carrying only a small fraction of the total cluster energy. Consequently, the impact effects of large clusters are substantial, but are limited to a very shallow surface region. This makes ion clusters effective for a variety of surface modification processes, without the tendency to produce deeper subsurface damage characteristic of monomer ion beam processing.

Means for creation of and acceleration of such GCIBs are described in the reference (U.S. Pat. No. 5,814,194) previously cited. Presently available ion cluster sources produce clusters ions having a wide distribution of sizes, n (where n=the number of molecules in each cluster—in the case of monatomic gases like argon, an atom of the monatomic gas will be referred to as a molecule and an ionized atom of such a monatomic gas will be referred to as a molecular ion—or simply a monomer ion—throughout this discussion).

It is therefore an object of the present invention to provide a method of opening or widening the top of a trench or via structure which has an excessive overhang of material after barrier material and/or seed material deposition without significantly damaging or degrading the integrity of the remaining material in order to allow subsequent thin film deposition and/or filling of the structure.

It is also an object of the present invention to provide a method of effectively and efficiently redistributing the barrier and/or seed material from the thicker areas in the trench or via, usually the top or bottom of the structure, to the sidewalls without significantly damaging or degrading the integrity of the material in order to provide a more uniform, continuous thin film coverage of the structure.

It is a further object of the present invention to provide a method of fabricating a semiconductor device which reduces the voids present in the metal interconnect lines and/or contact vias thereby increasing the device fabrication yields.

It is a further object of the present invention to provide a method of efficiently fabricating a semiconductor device which allows for the recovery of failed devices due to an excessive overhang of material at the opening of trenches and vias after barrier material and/or copper seed material deposition.

SUMMARY OF THE INVENTION

The objects set forth above as well as further and other objects and advantages of the present invention are achieved by the embodiments of the invention described hereinbelow.

The present invention uses a GCIB to remove and/or redistribute material in the trenches and/or vias of integrated circuit interconnect structures including dual damascene interconnect structures, thereby improving the fabrication process and quality of metal interconnects in an integrated circuit. The process entails opening up or widening the top of a trench or via structure after barrier material and/or seed material deposition in order to allow subsequent thin film deposition and/or filling of the structure, redistributing the barrier and/or seed material from the thicker areas in the trench or via in order to provide a more uniform, continuous thin film coverage of the structure, and/or removing some of the excess and undesired material on the bottom of the structure without significantly damaging or degrading the integrity of the remaining material. The GCIB process may be applied after the barrier metal deposition and before the copper seed layer/copper electroplating or the process may be applied after the formation of the copper seed layer and before copper electroplating.

The present invention reduces the voids present in the metal interconnect lines and/or contact vias, increases the device fabrication yields, and allows for the recovery of failed devices thereby extending the usability of the current interconnect deposition technologies to the next generation integrated circuits and beyond.

BRIEF DESCRIPTION OF THE DRAWINGS

For a better understanding of the present invention, together with other and further objects thereof, reference is made to the accompanying drawings and detailed description, wherein:

FIG. 5 is a scanning electron micrograph of a cross sectional view of the bottom of a trench showing an uneven distribution and coverage of barrier material on the sidewalls and at the corners near the bottom;

FIG. 6 is a scanning electron micrograph of a cross sectional view of the bottom of a trench after processing with the present invention showing a more uniform, continuous barrier material layer;

DETAILED DESCRIPTION OF CERTAIN PREFERRED EMBODIMENTS OF THE INVENTION

Figure 1:
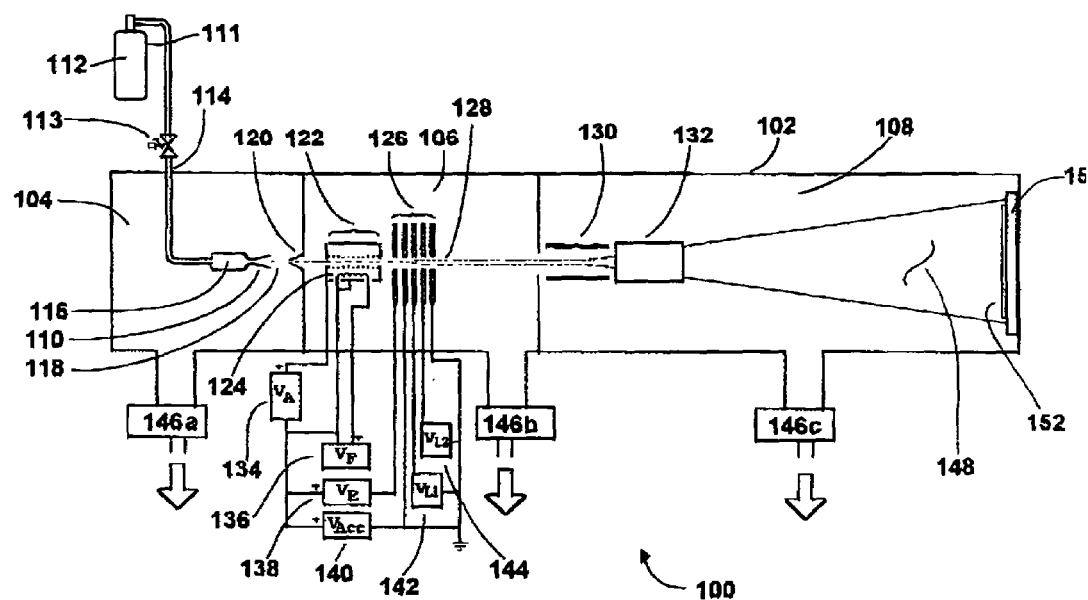
FIG. 1 is a schematic showing the basic elements of an electrostatically scanned GCIB processing apparatus which may be used in the present invention.

FIG. 1 shows a schematic of the basic elements of a typical configuration for a GCIB processor 100 of a form known in prior art, and which may be described as follows: a vacuum vessel 102 is divided into three communicating chambers, a source chamber 104, an ionization/acceleration chamber 106, and a processing chamber 108. The three chambers are evacuated to suitable operating pressures by vacuum pumping systems 146a, 146b, and 146c, respectively. A condensable source gas 112 (for example argon or $N_2$) stored in a gas storage cylinder 111 is admitted under pressure through gas metering valve 113 and gas feed tube 114 into stagnation chamber 116 and is ejected into the substantially lower pressure vacuum through a properly shaped nozzle 110. A supersonic gas jet 118 results. Cooling, which results from the expansion in the jet, causes a portion of the gas jet 118 to condense into clusters, each consisting of from several to several thousand weakly bound atoms or molecules. A gas skimmer aperture 120 partially separates the gas molecules that have not condensed into a cluster jet from the cluster jet so as to minimize pressure in the downstream regions where such higher pressures would be detrimental (e.g., ionizer 122, high voltage electrodes 126, and process chamber 108). Suitable condensable source gases 112 include, but are not necessarily limited to argon, nitrogen, carbon dioxide, oxygen, and other gases.

After the supersonic gas jet 118 containing gas clusters has been formed, the clusters are ionized in an ionizer 122. The ionizer 122 is typically an electron impact ionizer that produces thermoelectrons from one or more incandescent filaments 124 and accelerates and directs the electrons causing them to collide with the gas clusters in the gas jet 118, where the jet passes through the ionizer 122. The electron impact ejects electrons from the clusters, causing a portion the clusters to become positively ionized. A set of suitably biased high voltage electrodes 126 extracts the cluster ions from the ionizer, forming a beam, then accelerates them to a desired energy (typically from 1 keV to several tens of keV) and focuses them to form a GCIB 128. Filament power supply 136 provides voltage $V_F$ to heat the ionizer filament 124. Anode power supply 134 provides voltage $V_A$ to accelerate thermoelectrons emitted from filament 124 to cause them to irradiate the cluster containing gas jet 118 to produce ions. Extraction power supply 138 provides voltage $V_E$ to bias a high voltage electrode to extract ions from the ionizing region of ionizer 122 and to form a GCIB 128. Accelerator power supply 140 provides voltage $V_{ACC}$ to bias a high voltage electrode with respect to the ionizer 122 so as to result in a total GCIB acceleration energy equal to $V_{ACC}$ electron volts (eV). One or more lens power supplies (142 and 144 shown for example) may be provided to bias high voltage electrodes with potentials ($V_{L1}$ and $V_{L2}$ for example) to focus the GCIB 128.

A workpiece 152, which may be a semiconductor wafer or other workpiece to be processed by GCIB processing, is held on a workpiece holder 150, disposed in the path of the GCIB 128. Since most applications contemplate the processing of large workpieces with spatially uniform results, a scanning system is desirable to uniformly scan the GCIB 128 across large areas to produce spatially homogeneous results. Two pairs of orthogonally oriented electrostatic scan plates 130 and 132 can be utilized to produce a raster or other scanning pattern across the desired processing area. When beam scanning is performed, the GCIB 128 is converted into a scanned GCIB 148, which scans the entire surface of workpiece 152.

Figure 2:
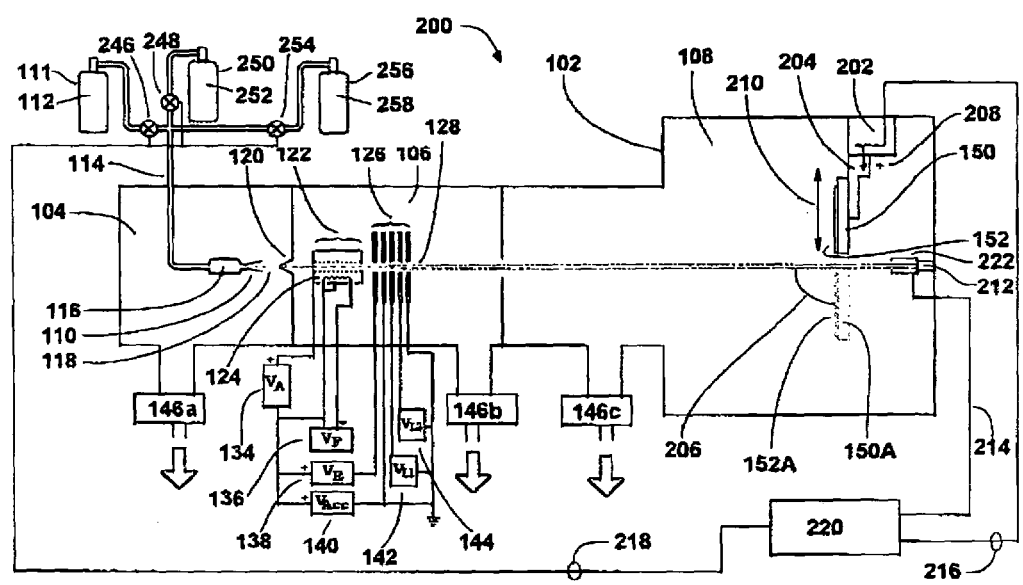
FIG. 2 is a schematic showing the basic elements of a mechanically scanned GCIB processing apparatus which may be used in the present invention.

FIG. 2 shows a schematic of the basic elements of a mechanically scanning GCIB processor 200, which uses a mechanical scanning technique to scan the workpiece 152 relative to the GCIB. GCIB formation is similar to as shown in FIG. 1, but in mechanically scanning GCIB processor 200 of FIG. 2, the GCIB 128 is stationary (not scanned) and the workpiece 152 is mechanically scanned through the GCIB 128 to distribute the effects of the GCIB 128 over a surface of the workpiece 152. Also, the single source gas supply of FIG. 1 is supplemented by an additional condensable source gases 252 and 258, stored in a second and third gas storage cylinders 250 and 256 respectively. Three controllable valves, 246, 248, and 254, control flow of condensable source gases 112, 252, and 258 respectively. With suitable controls, valves 246, 248, and 254 can select any of source gases 112, 252, or 258 or can deliver a mixture of two or more of gases 112, 252, and 258, through gas feed tube 114 to stagnation chamber 116. Valves 246, 248, and 254 are preferably electronically controllable mass flow control valves with complete shut-off capability.

An X-scan actuator 202 provides linear motion of the workpiece holder 150 in the direction of X-scan motion 208 (into and out of the plane of the paper). A Y-scan actuator 204 provides linear motion of the workpiece holder 150 in the direction of Y-scan motion 210, which is orthogonal to the X-scan motion 208. The combination of X-scanning and Y-scanning motions moves the workpiece 152, held by the workpiece holder 150 in a raster-like scanning motion through GCIB 128 to cause a uniform irradiation of a surface of the workpiece 152 by the GCIB 128 for uniform processing of the workpiece 152. The workpiece holder 150 disposes the workpiece 152 at an angle with respect to the axis of the GCIB 128 so that the GCIB 128 has an angle of beam incidence 206 with respect to the workpiece 152 surface. The angle of beam incidence 206 may be 90 degrees or some other angle so as to optimally position the trenches or vias on the surface of the workpiece 152 exposed to the GCIB 128. During Y-scanning, the workpiece 152 held by workpiece holder 150 moves from the position shown to the alternate position "A", indicated by the designators 152A and 150A respectively. Notice that in moving between the two positions, the workpiece 152 is scanned through the GCIB 128 and in both extreme positions, is moved completely out of the path of the GCIB 128 (over-scanned). Though not shown explicitly in FIG. 2, similar scanning and over-scan is performed in the orthogonal X-scan motion 208 direction (in and out of the plane of the paper).

A beam current sensor 222 is disposed beyond the workpiece holder 150 in the path of the GCIB 128 so as to intercept a sample of the GCIB 128 when the workpiece holder 150 is scanned out of the path of the GCIB 128. The beam current sensor 222 is preferably a faraday cup or the like and is affixed to the wall of the vacuum vessel 102 with an electrically insulating mount 212.

A controller 220, which may be a microcomputer based controller connects to the X-scan actuator 202 and the Y-scan actuator 204 through electrical cable 216 and controls the X-scan actuator 202 and the Y-scan actuator 204 so as to place the workpiece 152 into or out of the GCIB 128 and to scan the workpiece 152 uniformly relative to the GCIB 128 to achieve uniform processing of the workpiece 152 by the GCIB 128. Controller 220 receives the sampled beam current collected by the beam current sensor 222 by way of lead 214 and thereby monitors the GCIB and controls the GCIB dose received by the workpiece 152 by removing the workpiece 152 from the GCIB 128 when a predetermined desired dose has been delivered. Controller 220 also connects to valves 246, 248, and 254 through electrical cable 218 and controls valves 246, 248, and 254 to select any source gases 112, 252, or 258, or to select two or more gases in a mixture having controllable ratios of each constituent gas. Controller 220 also sets the flow rate of the selected source gas or the mixture of gases through the gas feed tube 114 to the stagnation chamber 116 for generating a gas jet 118 having a known and controllable constitution. Accordingly, a GCIB 128 having been formed from a source gas having a known and controllable constitution, which may be a single gas or a mixture of two or more gases can be generated. Controller 220 may be a portion of a general system controller that controls other functions and operation of the mechanically scanning GCIB processor 200. It is recognized that additional gas cylinders having additional gases controlled by additional valves could be provided to increase the mixture possibilities for the GCIB source gas constitution. It is also recognized that any single gas cylinder, cylinder 111 for example, could be filled with a source gas mixture in a premixed ratio of two or more source gases to provide a source gas mixture using a single gas cylinder and valve.

Figure 3:
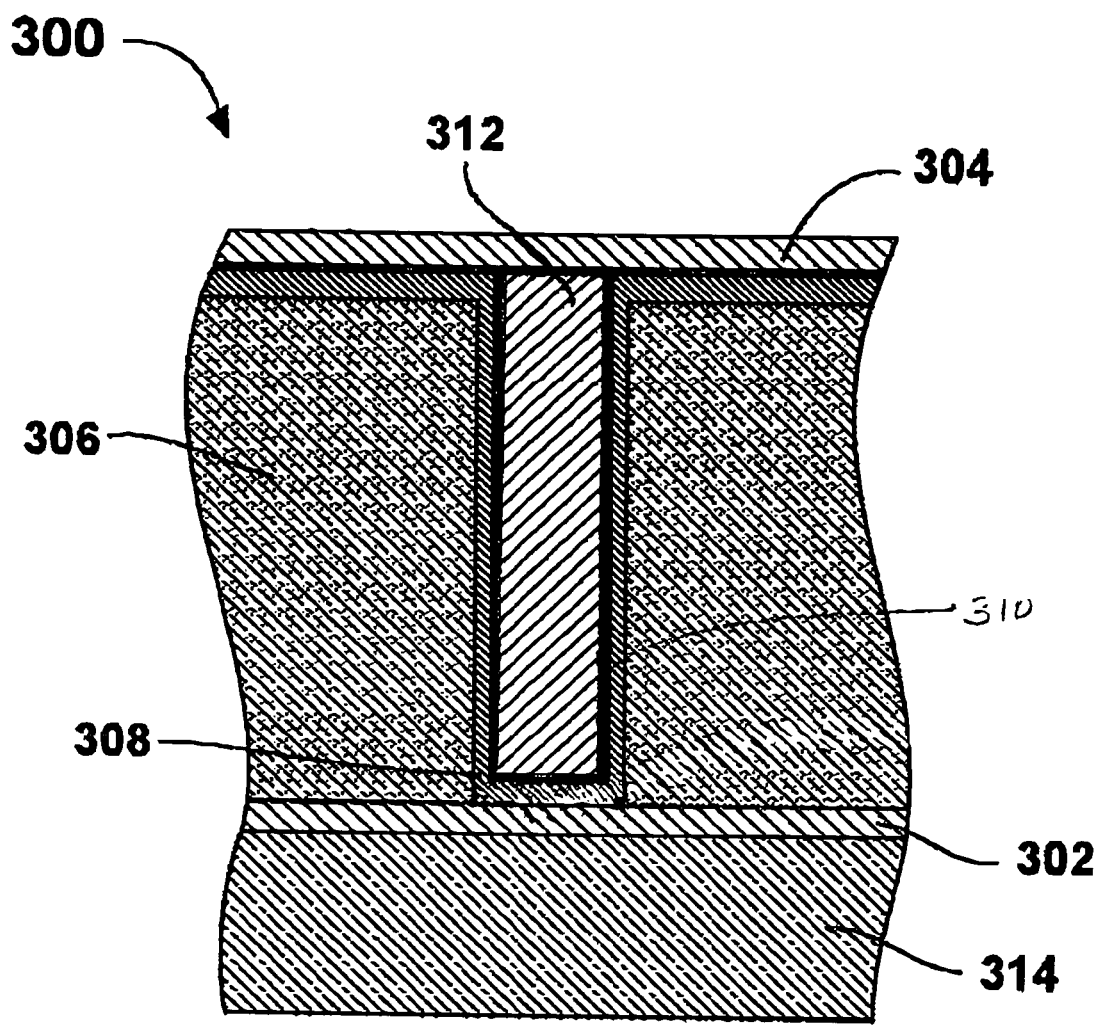
FIG. 3 is a schematic of a typical copper interconnect via between two metal interconnection layers of an integrated circuit.

FIG. 3 shows a schematic of a typical copper interconnect via structure 300, during a stage of fabrication of an integrated circuit. Metal interconnect layers 302 and 304 are two of what may eventually be several interconnection layers on the integrated circuit. An interconnect via between the two metal interconnect layers 302 and 304 is lined with a barrier material 308 and copper seed material 310 and subsequently filled with an electroplated copper material 312. The two metal interconnect layers 302 and 304 are separated by an interlayer dielectric material 306. Other interconnect via structures, not using copper as the interconnect metal, will have similar features as shown in FIG. 3 except for the copper seed layer 310.

Figure 4:
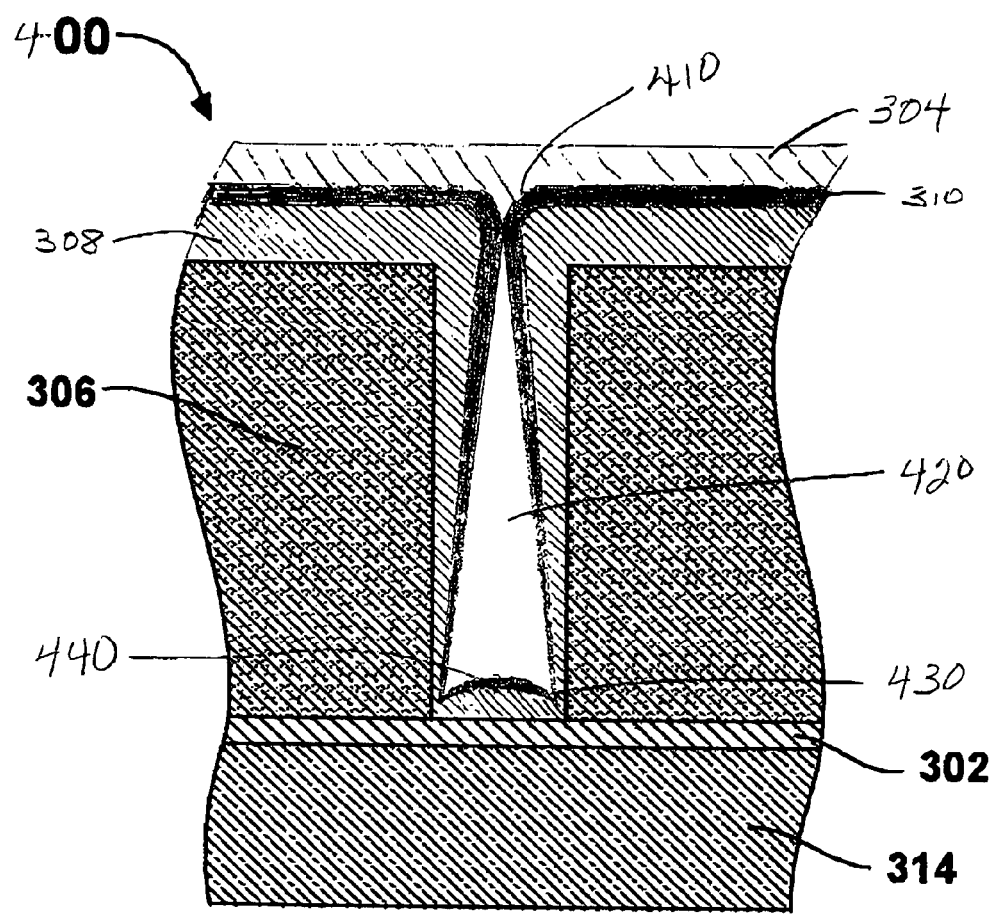
FIG. 4 is a schematic of a copper interconnect via showing the problems that may occur during thin film deposition processes.

FIG. 4 is a schematic of a copper interconnect via structure 400 showing the problems that may occur during thin film deposition processes. The uneven distribution of barrier material 308 and/or copper seed material 310 may result in an excessive overhang of material 410 at the top of the trench or via. This overhang of material 410 may cause a "necking in" of the trench or via opening which may restrict or prohibit subsequent thin film depositions and/or filling of the structure with the interconnect metal 304. A void 420 is produced where the interconnect metal 304 is unable to fill the structure. The uneven distribution of barrier material 308 and/or copper seed material 310 may also result in poor sidewall coverage, especially near the bottom corners of the structure 430. The poor sidewall coverage may result in too thin of a barrier material layer to prevent copper diffusion and/or too thin of a copper seed layer to allow subsequent copper electroplating. The uneven distribution of barrier material 308 and/or copper seed material 310 may also result in a build up of material at the bottom of the trenches or vias 440. This thicker material 440 at the bottom may cause the structures to have substantially higher intrinsic resistivities compared to the interconnect metals 304 and may also contribute to a discontinuous coverage of the copper seed material 310 near the bottom corners of the structure 430.

By applying gas cluster ion beam technology according to the invention, a method is provided for opening up or widening the top of a trench or via structure after barrier material and/or seed material deposition in order to allow subsequent thin film deposition and/or filling of the structure, redistributing the barrier and/or seed material from the thicker areas in the trench or via in order to provide a more uniform, continuous thin film coverage of the structure, and/or removing some of the excess and undesired material on the bottom of the structure without significantly damaging or degrading the integrity of the remaining material.

The etching/sputtering of the barrier material and/or copper seed material present on the interconnect trench or via sidewall is greatly minimized by the use of a gas cluster ion beam applied at approximately normal incidence to the surface of the integrated circuit (which is approximately parallel to the axis of the cylindrical interconnect via, or in the case of a trench-like via, approximately parallel to the median plane of the trench). It is preferable that the GCIB have as low a divergence and emittance as is practical consistent with adequate beam flux density to provide practical processing speed. It is recognized that such practical GCIBs may have deviations on the order of a few degrees. Such gas cluster ions as may impact sidewalls, because of deviation of beam elements from parallelism to the via axis, have a very low sputter yield compared to those that strike surfaces at approximately normal incidence. This sputtering characteristic is notably different from that which occurs when conventional monomer ions are employed. Monomer ions have much higher sputter yields at low angles of incidence than at near-normal incidence and this contributes to the destruction of the sidewalls. Monomer ions also produce damage in the underlying material that is not sputtered away. GCIB etching is effective in selectively removing and/or redistributing the material at the bottom of an interconnect via or trench without significantly damaging or degrading the integrity of the material. The GCIB etching is also effective in opening or widening the top of a trench or via structure without significantly damaging or degrading the integrity of the remaining material.

In the present invention, GCIBs composed of inert gases, such as argon, may be used as well as reactive gases. For instance, in order to remove the material at the bottom of an interconnect via, a GCIB comprising gas cluster ions of a mixture of an inert gas and a reactive gas such as fluorine (F), $SF_6$, $CF_4$, $Cl_2$, $BCl_3$, etc. may be used to volatize the material at the bottom of the via. When inert gas clusters alone are employed in the GCIB processing, the sputtered material from the bottom of the via structure tends to re-deposit on the sidewalls of the via. Adding fluorine-containing gas to the GCIB clusters, results in reduced re-depositing of sputtered material on the sidewalls of the via. In addition, oxygen or hydrogen gas may be added to the clusters to minimize the formation of C—F polymers when carbon material may be present in residues in the via bottoms or when a gas cluster ion beam constituent is carbon, for example when $CF_4$ is used as a fluorine bearing reactive gas. By reducing polymer formation, the tendency to redeposit sputtered material from the bottoms of the vias on the sidewalls is also reduced. In a dual damascene interconnect structure, the removal of barrier material and/or copper seed material will occur on all surfaces near-normal to the GCIB incidence. This also provides the advantage of thinning the material on top of the inter-metal dielectric, which is difficult to thin by CMP.

There are several advantages for GCIB removal and/or redistribution of material from trench or via structures compared to the more conventional plasma etching or reactive ion etching technologies: 1) GCIB processing is readily performed at less that $10^{-4}$ Torr. This is an order of magnitude lower process pressure and the mean free path of the reactive ions are correspondingly longer and can maintain a degree of beam collimation; 2) Gas cluster beams are formed from a nozzle source and typically employs beam optics and acceleration to form a substantially collimated beam of gas cluster ions; 3) Gas cluster ions may be directed to impact on a surface at a near-normal angle (parallel to the axis of a via); 4) Gas cluster ions may be formed with a mixture of gas species that will react to the barrier material and/or copper seed material (such as halogen-containing molecules F, $SF_6$, $CF_4$, $Cl_2$, $BCl_3$, etc.); 5) Gas cluster ions may contain a binding gas such as $O_2$ or $H_2$ gas that will react with free radical molecules (fluorinated) to help prevent polymerization of the fluorinated species.; 6) An additional GCIB cleaning process step may be used to remove surface oxides and contaminates from the barrier material and/or copper seed material; 7) A GCIB processing chamber may be readily connected to a deposition cluster tool to minimize re-oxidation before subsequent seed deposition or plug fill steps; and 8) In the case of a copper damascene process, the surface of the lower copper metal interconnect layer may be exposed and conditioned with GCIB to optimize the seed layer for subsequent copper grain growth.

FIG. 5 is a scanning electron micrograph of a cross sectional view of the bottom of a trench showing an uneven distribution and coverage of barrier material on the sidewalls and near the bottom corners of the structure.

FIG. 6 is a scanning electron micrograph of a cross sectional view of the bottom of a trench after processing by gas cluster ion beam according to the present invention showing a more uniform, continuous barrier material layer. In this example, the gas cluster ion beam processing was done in two steps, a first more aggressive process for faster material redistribution followed by a second less aggressive process to provide a smooth high quality surface finish. Details of the two-step process are shown in Table 1. The processing parameters listed are in no way meant to be limiting, as artisans will readily understand that other processing values could just as easily have been employed.

TABLE 1

Exemplary GCIB Processing Conditions

| Step | Gas | Beam Energy (keV) | Ion Dose (ions/cm$^2$) |
|---|---|---|---|
| 1 | Ar | 25 | $1 \times 10^{16}$ |
| 2 | Ar | 3 | $3 \times 10^{15}$ |

Figure 7:
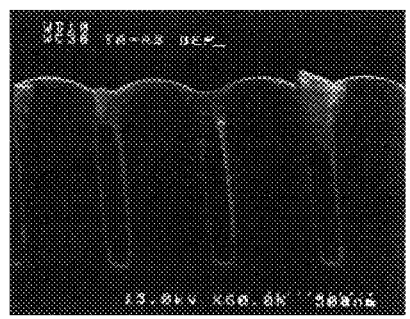
FIG. 7 is a scanning electron micrograph of a cross sectional view of contact vias showing an excessive amount of material at the top of the structure after barrier material deposition.

FIG. 7 is a scanning electron micrograph of a cross sectional view of contact vias showing an excessive amount of material at the top of the structure after barrier material deposition. The vias are completely closed off and subsequent copper seed material and electroplated copper deposition can not fill the structure thereby creating a void in the interconnect metal lines or contact vias.

Figure 8:
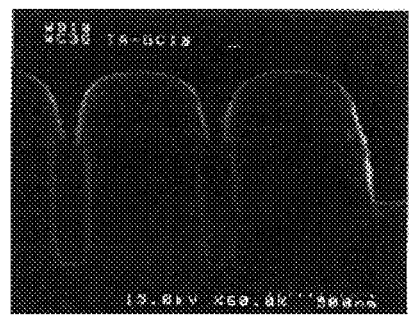
FIG. 8 is a scanning electron micrograph of a cross sectional view of contact vias showing the removal of barrier material at the top of the structure.

FIG. 8 is a scanning electron micrograph of a cross sectional view of contact vias showing the removal of barrier material at the top of the via after processing by gas cluster ion beam according to the present invention thereby allowing the subsequent processing of the structure. In this example, the gas cluster ion beam processing was approximately the same as that shown in the example shown in FIG. 6, namely, the two-step process shown in Table 1.

Although the invention has been described with respect to various embodiments, it should be realized this invention is also capable of a wide variety of further and other embodiments within the spirit of the invention.

I claim:

1. Method of processing a recess extending into a semiconductor substrate and having undesired material which reduces the size of an opening of the recess, comprising the step of controllably directing an accelerated gas cluster ion beam at the undesired material.

2. The method of claim 1, wherein the accelerated gas cluster ion beam etches the undesired material so as to remove some or all of the undesired material.

3. The method of claim 2, wherein the undesired material is a barrier material.

4. The method of claim 2, wherein the undesired material is a seed material.

5. The method of claim 2, wherein the undesired material is a metal including at least one component selected from the group consisting of Ta, TiN, TaN, WN and Cu.

6. The method of claim 2, wherein the gas cluster ion beam comprises inert gas cluster ions.

7. The method of claim 2, wherein the gas cluster ion beam comprises gas cluster ions selected from the group consisting of Ar, F, $SF_6$, $CF_4$, O, and H.

8. The method of claim 2, wherein the gas cluster ion beam comprises gas cluster ions selected from the group consisting of $Cl_2$ and $BCl_3$.

9. The method of claim 2, wherein the gas cluster ion beam comprises an inert gas component, a halogen-bearing gas component, and a component selected from the group consisting of O and H.

10. The method of claim 2, wherein:
the recess is a substantially cylindrical via having a central axis; and
the gas cluster ion beam is directed approximately parallel to said central axis.

11. The method of claim 2, wherein:
the recess is a trench having an imaginary median surface; and
the gas cluster ion beam is directed approximately parallel to the imaginary median surface.

12. A method of redistributing a material unevenly distributed at an opening of or within a recess extending into a semiconductor substrate, comprising the step of directing an accelerated gas cluster ion beam at the material.

13. The method of claim 12, wherein:
the recess further includes a sidewall and a bottom; and
the accelerated gas cluster ion beam moves a portion of the material to improve the evenness of the unevenly distributed material.

14. The method of claim 13, wherein the unevenly distributed material is a barrier material.

15. The method of claim 13, wherein the unevenly distributed material is a seed material.

16. The method of claim 13, wherein:
the unevenly distributed material is thicker in a region near the opening and thinner in a region within the recess; and
the accelerated gas cluster ion beam redistributes a portion of the material from the thicker region to the thinner region.

17. The method of claim 13, wherein:
the recess further includes a bottom corner where the sidewall and bottom join;
the unevenly distributed material has a discontinuity at or near the bottom corner; and
the accelerated gas cluster ion beam redistributes a portion of the unevenly distributed material to fill the discontinuity.

18. The method of claim 13, wherein the unevenly distributed material is a metal including at least one component selected from the group consisting of Ta, TiN, TaN, WN, and Cu.

19. The method of claim 13, wherein the gas cluster ion beam comprises inert gas cluster ions.

20. The method of claim 13, wherein the gas cluster ion beam comprises gas cluster ions selected from the group consisting of Ar, F, $SF_6$, $CF_4$, O, and H.

21. The method of claim 13, wherein the gas cluster ion beam comprises gas cluster ions selected from the group consisting of $Cl_2$ and $BCl_3$.

22. The method of claim 13, wherein the gas cluster ion beam comprises an inert gas component, a halogen-bearing gas component, and a component selected from the group consisting of O and H.

23. The method of claim 13, wherein:
the recess is a substantially cylindrical via having a central axis; and
the gas cluster ion beam is directed approximately parallel to said central axis.

24. The method of claim 12, wherein:
the recess is a trench having an imaginary median surface; and
the gas cluster ion beam is directed approximately parallel to the imaginary median surface.

25. A method of processing a recess extending into a semiconductor substrate and having a void formed therein by an undesired material obstructing an opening of the recess, comprising the step of directing an accelerated gas cluster ion beam at the undesired material.

26. The method of claim 25, wherein the accelerated gas cluster ion beam etches the undesired material so as to reopen the obstructed opening of the recess.

27. The method of claim 25, wherein the unevenly distributed material is a barrier material.

28. The method of claim 25, wherein the unevenly distributed material is a seed material.

29. The method of claim 25, wherein the unevenly distributed material is a metal including at least one component selected from the group consisting of Ta, TiN, TaN, WN, and Cu.

30. The method of claim 25, wherein the gas cluster ion beam comprises inert gas cluster ions.

31. The method of claim 25, wherein the gas cluster ion beam comprises gas cluster ions selected from the group consisting of Ar, F, $SF_6$, $CF_4$, O, and H.

32. The method of claim 25, wherein the gas cluster ion beam comprises gas cluster ions selected from the group consisting of $Cl_2$ and $BCl_3$.

33. The method of claim 25, wherein the gas cluster ion beam comprises an inert gas component, a halogen-bearing gas component, and a component selected from the group consisting of O and H.

34. The method of claim 25, wherein:
the recess is a substantially cylindrical via having a central axis; and
the gas cluster ion beam is directed approximately parallel to the central axis.

35. The method of claim 25, wherein:
the recess is a trench having an imaginary median surface; and
the gas cluster ion beam is directed approximately parallel to the imaginary median surface.

* * * * *